US006956886B1

(12) United States Patent
Patel

(10) Patent No.: US 6,956,886 B1
(45) Date of Patent: Oct. 18, 2005

(54) DISCREETLY TUNABLE SEMICONDUCTOR LASER ARRANGEMENT FOR WAVELENGTH DIVISION MULTIPLEX COMMUNICATION SYSTEMS

(76) Inventor: C. Kumar N. Patel, 1171 Roberto La., Los Angeles, CA (US) 90077

(*) Notice: Subject to any disclaimer, the term of this patent is extended or adjusted under 35 U.S.C. 154(b) by 0 days.

(21) Appl. No.: 10/286,171

(22) Filed: Oct. 31, 2002

Related U.S. Application Data

(60) Provisional application No. 60/339,834, filed on Nov. 2, 2001.

(51) Int. Cl.[7] .............................................. H01S 3/08
(52) U.S. Cl. ............................ 372/92; 372/20; 372/32
(58) Field of Search ............................... 372/99, 20, 32, 372/92

(56) References Cited

U.S. PATENT DOCUMENTS

| | | | |
|---|---|---|---|
| 3,498,693 A | 3/1970 | Fein et al. .................. 350/160 |
| 3,872,407 A | 3/1975 | Hughes ..................... 332/7.51 |
| 4,092,659 A | 5/1978 | Ettenberg ..................... 357/18 |
| 4,752,130 A | 6/1988 | George et al. .............. 356/334 |
| 4,839,308 A | 6/1989 | Fye ............................ 431/129 |
| 4,896,325 A | 1/1990 | Coldren ........................ 372/20 |
| 4,920,541 A | 4/1990 | Baumgartner et al. ........ 372/23 |
| 5,434,874 A | 7/1995 | Fouquet et al. ............... 372/20 |
| 5,943,352 A * | 8/1999 | Fee ............................. 372/32 |
| 5,970,190 A | 10/1999 | Fu et al. ...................... 385/37 |
| 6,041,071 A | 3/2000 | Tayebati ...................... 372/64 |
| 6,049,554 A | 4/2000 | Lang et al. ................... 372/20 |
| 6,122,299 A | 9/2000 | De Mars et al. .............. 372/20 |
| 6,205,159 B1 * | 3/2001 | Sesko et al. .................. 372/20 |
| 6,259,308 B1 | 7/2001 | Torazawa ..................... 375/50 |
| 6,282,213 B1 * | 8/2001 | Gutin et al. .................. 372/20 |
| 6,704,332 B2 * | 3/2004 | Chapman et al. ............. 372/20 |
| 6,718,092 B2 * | 4/2004 | Wang et al. .................. 385/37 |
| 6,724,797 B2 * | 4/2004 | Daiber ......................... 372/92 |
| 2002/0054424 A1 * | 5/2002 | Miles ......................... 359/291 |
| 2002/0181849 A1 * | 12/2002 | Flanders ...................... 385/18 |

* cited by examiner

*Primary Examiner*—Minsun Oh Harvey
*Assistant Examiner*—Cornelius H. Jackson
(74) *Attorney, Agent, or Firm*—Cislo & Thomas, LLP

(57) ABSTRACT

A wavelength selection element for a tunable laser provides for a single laser structure system that can be made to generate any specific wavelength. The wavelength selection element comprises a transmission component which may include an arrangement of optical components mirrors designed to transmit (e.g. using an array of narrow band pass filters and/or mirrors), and a reflection component, which may include an array of stationary mirrors and MEM (Micro Electro Mechanical) mirrors that are adjustable under local or remote control, to reflect light of a specific wavelength such that the desired wavelength will be filtered from the light coming in from the laser and containing all the wavelength components and selectively reflected back through the semiconductor laser while light of other wavelengths not selected will not be reflected back through the laser. The wavelength selection element can be manipulated through software control wherein the position of various components such as mirrors and/or retroreflectors may be manipulated such that the desired wavelength will be selectively transmitted. Curved reflective mirrors or reflectors, as well as flat mirrors may be used in accordance with various embodiments.

11 Claims, 3 Drawing Sheets

DISCREETLY TUNABLE SEMICONDUCTOR LASER ARRANGEMENT FOR WAVELENGTH DIVISION MULTIPLEX COMMUNICATION SYSTEMS

CROSS-REFERENCES TO RELATED APPLICATIONS

This patent application is related to U.S. Provisional Patent Application Ser. No. 60/339,834 filed Nov. 2, 2001 for A DISCREETLY TUNABLE SEMICONDUCTOR LASER ARRANGEMENT FOR WAVELENGTH DIVISION MULTIPLEX COMMUNICATION SYSTEMS, which application is incorporated herein by this reference thereto.

BACKGROUND OF THE INVENTION

1. Field of the Invention

This invention relates to lasers, and in particular to lasers having a tunable wavelength.

2. Description of the Related Art

Wavelength division multiplex systems require semiconductor lasers that are accurately set at the ITU (International Telecommunications Union) frequencies for proper operation. Conventional semiconductor lasers used for such systems are preset to requisite wavelengths by incorporating a distributed Bragg grating in or near the active region of the laser. The manufacturing technology is sufficiently complex for precise wavelength setting. Therefore, yields of lasers at the precise and guaranteeable ITU wavelengths are low, leading to high manufacturing costs.

Additionally, once a laser of a given wavelength is fabricated, its wavelength cannot practically be changed, except for very small, but undesirable variations, resulting from temperature or current tuning of the dielectric constant or the dimension of the grating. Additionally, as lasers age, undesirable wavelength may occur as a result of prolonged usage.

Wavelength variations, either due to aging or due to imprecise manufacturing, may degrade the performance of a system since the Dense Wavelength Division Multiplex (DWDM) wavelengths, set by ITU standards, have to propagate through multiplexers and/or demultiplexers (or other wavelength sensitive elements) which are set to precise wavelengths using passive filters or other wavelength discriminating components. Consequently, such lasers often require repair and replacement.

Additionally, a laser is needed for each wavelength used, and some operations may require as many as 60 or more lasers. Thus, there is a need for a single laser component that can be tuned to generate any of the ITU wavelengths with precision and under software control.

Additionally, optical switches will allow any wavelength channel to be switched to any of the customers. In order to make sure that the return wavelength from a particular customer is the same as the wavelength received by the customer without the customer premises being stocked with all possible ITU wavelength lasers, it would be very desirable to have a single "laser" which can be tuned to the desired ITU wavelength precisely, quickly, and under system administrator's software control.

SUMMARY OF THE INVENTION

Described is a tunable laser and a wavelength selection element for a tunable laser which provides a single laser structure system that can be made to generate any specific ITU wavelength.

The wavelength selection element comprises a transmission component which may include an arrangement of optical components mirrors designed to transmit (e.g. using an array of narrow band pass filters and/or mirrors), and a reflection component, which may include an array of stationary mirrors and MEM (Micro Electro Mechanical) mirrors that are adjustable under local or remote control, to reflect light of a specific wavelength such that the desired wavelength will be filtered from the light coming in from the laser and containing all the wavelength components and selectively reflected back through the semiconductor laser while light of other wavelengths not selected will not be reflected back through the laser. The wavelength selection element can be manipulated through software control wherein the position of various components such as mirrors and/or retroreflectors may be manipulated such that the desired wavelength will be selectively transmitted. Curved reflective mirrors, as well as flat mirrors may be used in accordance with various embodiments.

OBJECTS OF THE INVENTION

It is an object of the present invention to provide a single laser structure system for a tunable laser that can be made to generate any specific ITU wavelength.

It is further object of the present invention to provide a wavelength selection element for a tunable laser, for generation of any specific wavelength precisely under software control.

It is a further object of the present invention to provide a tunable laser using wavelength selection components currently used in multiplexers and demultiplexers.

These and other objects and advantages of the present invention will be apparent from a review of the following specification and accompanying drawings.

DESCRIPTION OF THE PREFERRED EMBODIMENT(S)

The detailed description set forth below in connection with the appended drawings is intended as a description of presently-preferred embodiments of the invention and is not intended to represent the only forms in which the present invention may be constructed and/or utilized. The description sets forth the functions and the sequence of steps for constructing and operating the invention in connection with the illustrated embodiments. However, it is to be understood that the same or equivalent functions and sequences may be accomplished by different embodiments that are also intended to be encompassed within the spirit and scope of the invention.

Figure 1:
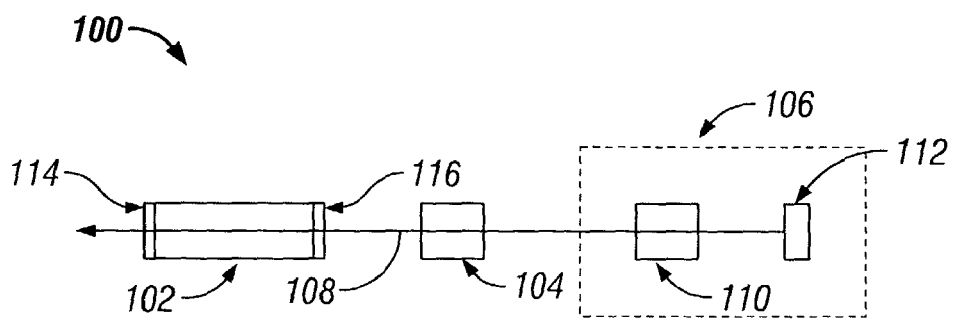
FIG. 1 is a shows an overall schematic of a tunable laser, which can be tuned to discrete ITU frequencies, in accordance with the present invention.

FIG. 1 shows an overall schematic of a step tunable (i.e., tunable to preset ITU wavelengths) semiconductor laser 100, comprising a wavelength selection element 106. The laser 100 further includes other components typical to a laser system, such as a semiconductor laser chip 102, and a mode matching element 104. The chip 102 may be fabricated, for example, using traditional growth and processing technologies appropriate for communication band wavelength lasers. One face of the chip 102 is coated with appropriate broadband partially reflective multilayer (or otherwise) coating 114 for coupling the laser power out from the chip. The other face of the laser is coated with broadband totally anti-reflection coating 116 appropriate for the wavelengths of concern for the communication band.

Following the axis 108, along which lasing will take place, beyond the anti-reflection coated surface is the mode matching element 104 that matches the guided mode output emanating from the semiconductor laser chip to a free space propagating mode. The free space propagating mode is coupled into the wavelength selection element 106 which comprises a discrete wavelength transmission component 110 and an externally controllable reflection component 112.

The wavelength transmission component 110 is a transmission device whose transmission frequencies are selectable. The reflection component 112 allows the discreet wavelengths to be selected under an external control and completes the laser resonator path at the selected wavelength.

By changing the characteristics of the wavelength selection element 106, the same path can become a resonator for a different wavelength. Thus, the same laser chip can be made to generate any of the laser wavelengths that are preset to the ITU frequencies under external control of the wavelength selection element 106.

Figure 2:
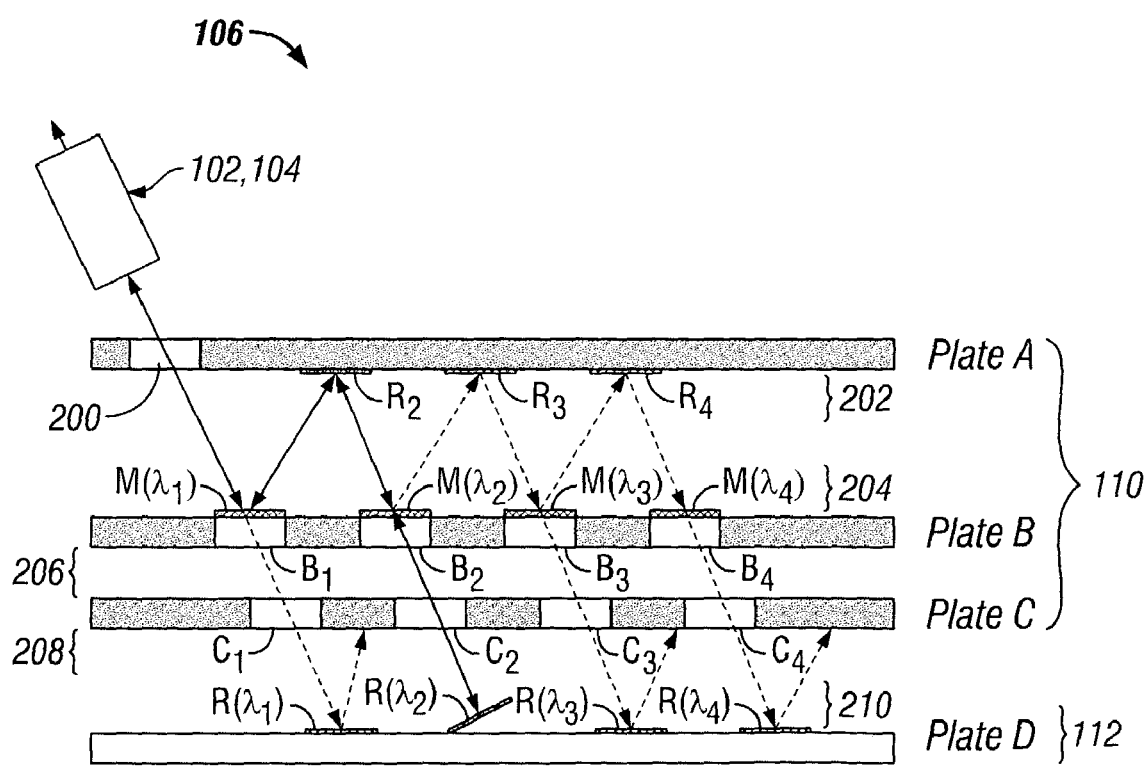
FIG. 2 illustrates the operation of a wavelength selection element according to one embodiment of the present invention, with the retroreflector $R(\lambda_2)$ in the activated position.

FIG. 2 shows one possible embodiment for the wavelength selection element 106 which can be digitally operated. This comprises three flat parallel plates, labeled "A," "B," and "C," forming the transmission component 110, as indicated in the figure, and a reflection component 112 (labeled as Plate "D") comprising a 1×N array of retroreflectors, which may be broadband high reflectivity MEM mirrors. An array of 1×4 is shown in the figure for simplicity; however, N may be any number corresponding to the desired number of selectable wavelengths.

Plate A has an aperture, 200 for coupling the collimated beam from the semiconductor chip 102 into the assembly, and an array 202 of broadband high reflectivity mirrors, $R_2 \ldots R_N$, positioned on Plate A, on a side opposite the chip 102, as illustrated in the figure.

Plate B has an array 204 of 1×N narrow band pass filter mirrors $M(\lambda_1) \ldots M(\lambda_N)$, each mirror being capable of transmitting a particular wavelength, $\lambda_n$, where n=1, 2, 3 . . . N, and reflecting all other wavelengths. The filter mirrors $M(\lambda_1) \ldots M(\lambda_N)$ cover a 1×N array 206 of apertures $B_1 \ldots B_N$.

Plate C also has a corresponding array 208 of apertures, $C_1 \ldots C_N$ as shown in the figure. Additionally, Plates A, B, and C are made of a light absorbing material, as indicated by the shaded sections in the figure.

Plate D has a corresponding array 210 of retroreflectors $R(\lambda_1) \ldots R(\lambda_N)$, wherein activation of $R(\lambda_n)$ will cause light of the wavelength $\lambda_n$, to be coupled back through the laser, as will be illustrated below.

FIG. 2 illustrates activation of $R(\lambda_2)$ to provide retro reflection for completing the laser cavity at a wavelength $\lambda_2$. The collimated light from the aperture 200 falls upon narrow band pass filter mirror $M(\lambda_1)$. The transmission wavelength of this narrow band filter is chosen to be at a wavelength $\lambda_1$, which is one of the wavelengths used by the transmission system. Light at $\lambda_1$, if present will be transmitted through the filter, the aperture $B_1$, the aperture $C_1$, and fall upon the retroreflector $R(\lambda_1)$. As shown in the figure, $R(\lambda_1)$ is not activated, and thus the light that is reflected from $R(\lambda_1)$ will be blocked by the absorbing plate C as shown. It should be understood that the system components, including plates, apertures, reflectors, and mirror elements are appropriately aligned for the light to follow the path as described.

The filter mirrors $M(\lambda_1, \lambda_2, \ldots \lambda_n)$ are designed so that all of the light that is not transmitted through the narrow band of frequencies $\lambda_1, \lambda_2, \ldots \lambda_n$) respectively, experiences high reflection. Thus, light not transmitted through $M(\lambda_1)$, corresponding to all the other ITU frequencies, $\lambda_2, \ldots \lambda_n$, will be reflected back up to the mirror $R_2$ and reflected to impinge upon $M(\lambda_2)$. If radiation at $\lambda_2$ is present, it will be transmitted through the narrow band filter $M(\lambda_2)$, the aperture $B_2$, the aperture $C_2$ and fall upon the retroreflector $R(\lambda_2)$. This retroreflector has been activated by angling it such that the light will be reflected through the aperture $C_2$, and thus acts as a retroreflector for the radiation at $\lambda_2$ retracing its path through aperture $C_2$, aperture $B_2$, filter mirror $M(\lambda_2)$, reflecting from mirror $R_2$, filter mirror $M(\lambda_1)$ which is high transmission at $\lambda_1$ but high reflectivity at all other wavelengths including $\lambda_2$, through the aperture 200, back into the semiconductor laser chip 102 through its antireflection coated surface.

Thus, the semiconductor laser cavity is complete at $\lambda_2$, causing the laser output at the precise ITU wavelength $\lambda_2$. It is worth noting that other wavelengths which are reflected by the filter mirror $M(\lambda_2)$ will not return to the laser and will eventually be absorbed, because their respective retroreflectors are not activated as seen in FIG. 2.

Figure 3:
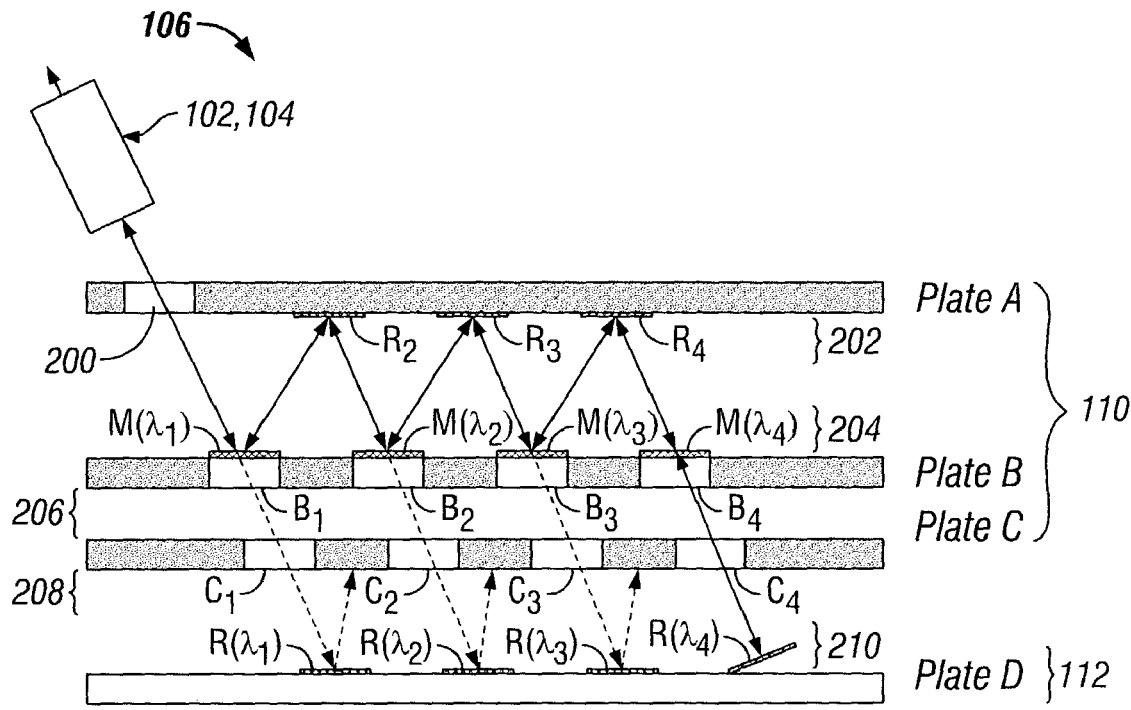
FIG. 3 illustrates the operation of the wavelength selection element of FIG. 2, with the retroreflector $R(\lambda_4)$ in the activated position.

To change the wavelength of the laser to another of the ITU wavelengths, say $\lambda_4$, the retroreflector $R(\lambda_4)$ can be activated, as shown in FIG. 3. This completes the optical cavity resonance path for $\lambda_4$ and the laser output occurs precisely on the ITU wavelength $\lambda_4$.

Thus, through software control alone, the laser can be made to operate at any of the set wavelengths for which the filter mirrors $M(\lambda_n)$ are mounted on Plate B. Precision of the laser operating wavelengths is determined by the filter mirrors $M(\lambda_n)$, which are the same components used in constructing the multiplexers and demultiplexers for the optical transmission systems. Thus the system integrity maintained regardless of the aging of the active component, the semiconductor laser chip.

Moreover, the precision of the wavelength is not dependent on the growth vagaries of the built in gratings used in the traditional distributed feedback (DFB) lasers. In addition, this scheme reduces the cost of the lasers used in the optical communication systems. Only a single laser structure has to be fabricated for the entire DWDM system. The wavelength selection is precise and can be done locally or remotely under the program control of the system.

There are many possible variations for a wavelength selection element in accordance with the present invention. For example, Plate C may not be required as long as the apertures and retroreflectors are aligned and sized such that activation of a particular retroreflector will cause the corresponding frequency to be reflected through an open path to the laser, and other unselected frequencies to be blocked by a light absorbing element. Additionally, multiple retroreflectors may be activated for simultaneous selection of a multiple number of frequencies.

Figure 4:
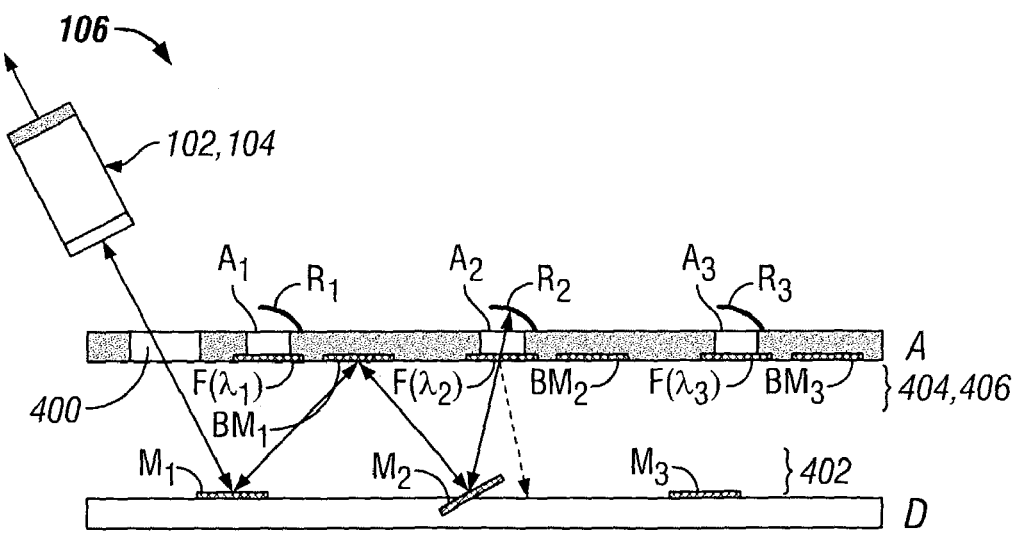
FIG. 4 illustrates the operation of a wavelength selection element according to an alternate embodiment for selecting light of wavelength $\lambda_2$.

FIG. 4, illustrates another variation for the construction of the wavelength selection element 106, which promises low throughput losses and a simple construction. The overall architecture of the laser system is the same as that described in FIG. 1. The wavelength selection scheme now comprises only two plates (Plate "A" and Plate "D"), as shown in the figure. Plate D has a 1×N array 402 of broadband high reflectivity mirrors (MEM mirrors) $M_1, M_2, \ldots M_N$, respectively. (While the figure shows a 1×3 array for convenience of illustration, again, it should be clear that any number of selectable wavelengths can be accommodated.

Light from a semiconductor laser chip 102 is coupled into the wavelength selection components through the aperture 400 in the plate A as shown (similar to the systems of FIGS. 2 and 3). This light encounters the mirror $M_1$ which is not activated, and thus reflects the light back up towards plate A as shown. The plate A includes an 1×N array 404 of broadband high reflectivity mirrors, $BM_1, BM_2, \ldots BM_N$, as shown, and a 1×N array 406 of narrow transmission band filters, $F(\lambda_1), F(\lambda_2), \ldots F(\lambda_N)$ at wavelengths $\lambda_1, \lambda_2, \ldots \lambda_N$, which are preferably appropriate for the ITU laser frequencies for DWDM systems. These filters are mounted in front of apertures $A_1, A_2 \ldots A_N$ of Plate A, as shown. Behind each of apertures $A_1, A_2, \ldots A_N$ there is mounted a curved mirror, $R_1, R_2, \ldots R_N$, of appropriate curvature and broadband high reflectivity. The curved mirrors are aligned to function as retroreflectors, as will be described below.

As illustrated in FIG. 4, Mirror $M_2$ is activated to provide retro reflection from curved mirror $R_2$, through filter $F(\lambda_2)$, to complete the laser cavity at the frequency $\lambda_2$. Light coming from the semiconductor chip 102, containing all the wavelength components including wavelengths $\lambda_1, \lambda_2, \ldots \lambda_n$, is reflected from the unactivatedk mirror $M_1$ onto the fixed mirror $BM_1$. The mirror $BM_1$ reflects this light on to the MEM mirror $M_2$ that has been activated to deflect the light into filter $F(\lambda_2)$ as shown. Filter $F(\lambda_2)$ transmits only the narrow band of frequencies around $\lambda_2$ through the aperture $A_2$, incident on the curved high reflectivity mirror $R_2$ which is aligned to retroreflect the radiation back through $F(\lambda_2)$ along the same forward propagation path. All other wavelengths, other than $\lambda_2$, will not be transmitted through the filter $F(\lambda_2)$ but will be reflected as shown. These wavelengths will eventually be absorbed.

A light absorbing material may be positioned at an end of the array, either on plate A and/or as part of array D in between MEM mirrors, $M_1 \ldots M_n$, such that wavelengths which are not selected will be absorbed.

The wavelength $\lambda_2$ transmitted through $F(\lambda_2)$, reflected by $R_2$, retransmitted through $F(\lambda_2)$ traces its path back to the laser chip and completes the laser cavity that is now resonant at only $\lambda_2$. Thus, the laser will lase at the ITU wavelength $\lambda_2$ determined by the passive filter $F(\lambda_2)$ that is identical to that used in the multiplexers and demultiplexers for these sets of wavelengths.

Figure 5:
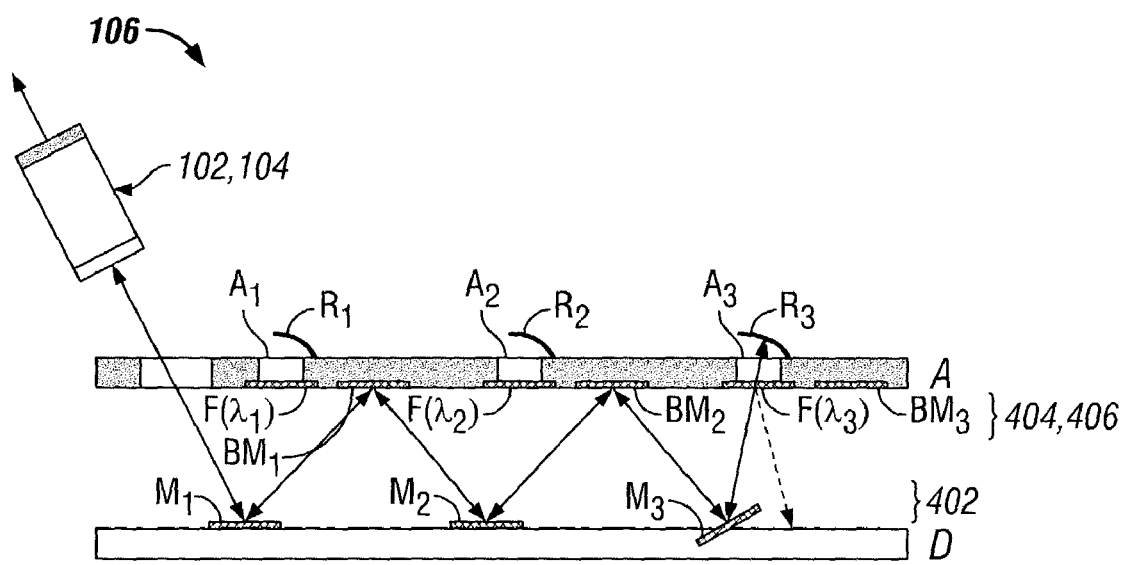
FIG. 5 illustrates the operation of the wavelength selection element of FIG. 4 for selecting light of wavelength $\lambda_3$.

To change the wavelength of the laser to another of the ITU wavelengths, say $\lambda_3$, the broadband high reflectivity MEM mirror $M_3$ is simply activated as shown in FIG. 5. This completes the optical cavity resonance path for $\lambda_3$ and the laser output occurs precisely on the ITU wavelength $\lambda_3$. It should be understood that the system components are appropriately aligned for the light to follow the path as described.

The mirrors $R_1 \ldots R_n$, which are shown to be curved, may also be flat, depending on the alignment of other components. Additionally, instead of the position switchable reflectivity mirrors or retroreflectors described in FIGS. 2–5, other elements may be used having a switchable optical property. For example, mirrors which are switchable between reflective and transmissive modes, or between reflective and light absorbing modes may be used, wherein each mirror may be optionally switched to the reflective mode for reflecting light of a desired wavelength, or to the other mode for not reflecting light which is not of a desired wavelength. Of course, other elements forming the optical path need to be aligned appropriately.

While the present invention has been described with regards to particular embodiments, it is recognized that additional variations of the present invention may be devised without departing from the inventive concept.

What is claimed is:

1. A tunable laser system, comprising:
a laser cavity;
a first plate in back of said laser cavity, said first plate having an array of filter mirrors, each filter mirror being adapted to transmit light of a particular wavelength, while reflecting light of all other wavelengths; and
a second plate in back of said first plate, said first plate being adapted to reflect light toward said second plate, said second plate having an array of reflectors corresponding to said array of filter mirrors, wherein activation of a particular reflector results in light of a particular wavelength being transmitted through a corresponding filter mirror and reflected back through said first plate into said laser cavity.

2. The tunable laser system of claim 1, wherein said reflectors are position switchable reflectors.

3. The tunable laser system of claim 1, further comprising a light absorbing element which absorbs light of wavelengths that are not selected.

4. The tunable laser system of claim 1, wherein said filter mirrors are narrow band pass filter mirrors.

5. The tunable laser system of claim 1, further comprising a laser mode matching element operatively coupled to said first plate.

6. The tunable laser system of claim 1, wherein said second plate is externally controllable.

7. A tunable laser system, comprising:
a laser cavity having a back side;
a first plate in spaced relation to said back side of said laser cavity, said first plate having an array of apertures;
a first array of reflectors on said first plate, each of said reflectors extending over a corresponding aperture of said array of apertures;
an array of filter mirrors in spaced relation to said first plate, each of said filter mirrors substantially covering a corresponding aperture opposite a respective reflector and being adapted to transmit light of a particular wavelength, while reflecting light of all other wavelengths; and
a second plate in spaced relation to said array of filter mirrors, said second plate having an array of switchable reflectors, wherein activation of a particular switchable reflector results in light of a particular wavelength being transmitted through a corresponding filter mirror and reflected back by a corresponding reflector of said first array of reflectors through a corresponding aperture of said first plate into said laser cavity.

8. The tunable laser system of claim 7, wherein each of said reflectors of said first array is curved.

9. The tunable laser system of claim 7, further comprising an additional uncovered aperture on said first plate through which unfiltered light passes to a switchable reflector on said second plate.

10. The tunable laser system of claim 7, further comprising a second array of reflectors on said first plate, each reflector of said second array being aligned adjacent to a filter mirror, wherein light reflected by an unactivated switchable reflector is received by a corresponding reflector of said second array and reflected to an adjacent switchable reflector.

11. The tunable laser system of claim 7, wherein said switchable reflectors are position switchable reflectors.

* * * * *